(12) United States Patent
Yatskov et al.

(10) Patent No.: US 7,177,156 B2
(45) Date of Patent: Feb. 13, 2007

(54) ASSEMBLIES FOR HOLDING HEAT SINKS AND OTHER STRUCTURES IN CONTACT WITH ELECTRONIC DEVICES AND OTHER APPARATUSES

(75) Inventors: Alexander I. Yatskov, Seattle, WA (US); Stephen V. R. Hellriegel, Seattle, WA (US)

(73) Assignee: Cray Inc., Seattle, WA (US)

( * ) Notice: Subject to any disclaimer, the term of this patent is extended or adjusted under 35 U.S.C. 154(b) by 125 days.

(21) Appl. No.: 10/886,911

(22) Filed: Jul. 8, 2004

(65) Prior Publication Data
US 2006/0007652 A1    Jan. 12, 2006

(51) Int. Cl.
*H05K 7/20* (2006.01)

(52) U.S. Cl. .................. 361/709; 361/687; 361/719; 312/223.2

(58) Field of Classification Search .................. None
See application file for complete search history.

(56) References Cited

U.S. PATENT DOCUMENTS

| | | | |
|---|---|---|---|
| 2,673,721 A | | 3/1954 | Dickinson |
| 2,861,782 A | | 11/1958 | Swartz |
| 3,317,798 A | | 5/1967 | Chu et al. |
| 4,315,300 A | | 2/1982 | Parmerlee et al. |
| 4,993,482 A | | 2/1991 | Dolbear et al. |
| 5,035,628 A | * | 7/1991 | Casciotti et al. .............. 439/66 |
| 5,060,716 A | | 10/1991 | Heine |
| 5,150,277 A | | 9/1992 | Bainbridge et al. |
| 5,161,087 A | * | 11/1992 | Frankeny et al. ........... 361/702 |
| 5,273,438 A | * | 12/1993 | Bradley et al. ............... 439/66 |
| 5,323,847 A | | 6/1994 | Koizumi et al. |
| 5,329,425 A | | 7/1994 | Leyssens et al. |
| 5,365,402 A | | 11/1994 | Hatada et al. |
| 5,376,008 A | * | 12/1994 | Rodriguez .................... 439/66 |
| 5,395,251 A | * | 3/1995 | Rodriguez et al. ............ 439/66 |
| 5,402,313 A | * | 3/1995 | Casperson et al. .......... 361/710 |
| 5,410,448 A | | 4/1995 | Barker, III et al. |
| 5,685,363 A | | 11/1997 | Orihira et al. |
| 6,046,908 A | * | 4/2000 | Feng .......................... 361/707 |
| 6,115,242 A | * | 9/2000 | Lambrecht .................. 361/684 |

(Continued)

OTHER PUBLICATIONS

Baer, D.B., "Emerging Cooling Requirements & Systems in Telecommunications Spaces," Telecommunications Energy Conference 2001, Oct. 14-18, 2001, pp. 95-100.

(Continued)

*Primary Examiner*—Anatoly Vortman
*Assistant Examiner*—Anthony Q. Edwards
(74) *Attorney, Agent, or Firm*—Perkins Coie LLP

(57) ABSTRACT

Structures and methods for positioning heat sinks in contact with electronic devices are described herein. In one embodiment, a structure for holding a heat sink in contact with an electronic device in accordance with one aspect of the invention includes an electronic device holding portion and a heat sink holding portion. The electronic device holding portion is configured to support the electronic device. The heat sink holding portion is configured to position the heat sink in contact with the electronic device. The structure further includes a spring holding portion configured to support a coil spring in transverse compression. When transversely compressed, the coil spring presses the heat sink against the electronic device with a uniform, or at least approximately uniform, pressure that enables the heat sink to efficiently conduct heat away from the electronic device without damaging the device.

55 Claims, 8 Drawing Sheets

U.S. PATENT DOCUMENTS

| | | | |
|---|---|---|---|
| 6,158,502 A | 12/2000 | Thomas | |
| 6,167,948 B1 | 1/2001 | Thomas | |
| 6,310,773 B1 * | 10/2001 | Yusuf et al. | 361/704 |
| 6,332,946 B1 | 12/2001 | Emmett et al. | |
| 6,416,330 B1 | 7/2002 | Yatskov | |
| 6,435,266 B1 | 8/2002 | Wu | |
| 6,515,862 B1 * | 2/2003 | Wong et al. | 361/710 |
| 6,519,955 B2 | 2/2003 | Marsala | |
| 6,550,530 B1 | 4/2003 | Bilski | |
| 6,564,858 B1 | 5/2003 | Stahl | |
| 6,644,384 B2 | 5/2003 | Stahl | |
| 6,631,078 B2 | 10/2003 | Alcoe | |
| 6,679,081 B2 | 1/2004 | Marsala | |
| 6,772,604 B2 | 8/2004 | Bash et al. | |
| 6,975,510 B1 | 12/2005 | Robbins et al. | |
| 6,992,889 B1 * | 1/2006 | Kashiwagi et al. | 361/700 |
| 6,999,316 B2 | 2/2006 | Hamman | |
| 7,120,027 B2 | 10/2006 | Yatskov et al. | |
| 2001/0052412 A1 | 12/2001 | Tikka | |
| 2004/0250990 A1 | 12/2004 | Schaper | |
| 2005/0120737 A1 | 6/2005 | Borror et al. | |
| 2005/0162834 A1 | 7/2005 | Nishimura | |
| 2005/0168945 A1 | 8/2005 | Coglitore | |
| 2005/0241810 A1 | 11/2005 | Malone et al. | |

OTHER PUBLICATIONS

"Heat Spreaders," Novel Concepts, Inc., http://www.novelconceptsinc.com/heat-spreaders.htm, 2 pages [accessed Jun. 14, 2004].

"Frequently Asked Questions about Heat Pipes," Thermacore International, Inc., http://www.thermacore.com/hpt_faqs.htm, 3 pages [accessed Jun. 14, 2004].

JAMSTEC/Earth Simulator Center, "Processor Node (PN) Cabinet," http://www.es.jamstec.go.jp/esc/eng/Hardware/pnc.html, 1 page [accessed Mar. 5, 2004].

Pitasi, M. "Thermal Management System Using Pumped Liquid R-134a with Two Phase Heat Transfer," Thermal Form & Function LLC, Manchester, MA, http:/www.coolingzone.com/Guest/News/NL_MAR_2002/TFF/Tff.html, pp. 1-9, Mar. 2002.

Webb, Warren, "Take the heat: Cool that hot embedded design," *EDN*, May 13, 2004, 5 pages.

* cited by examiner

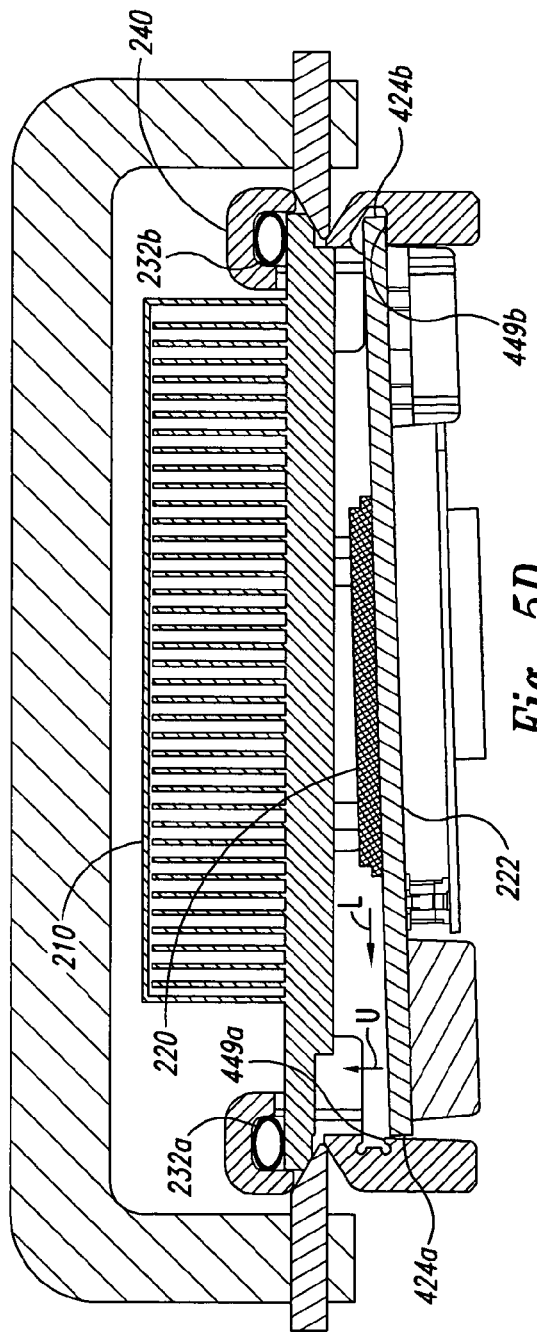
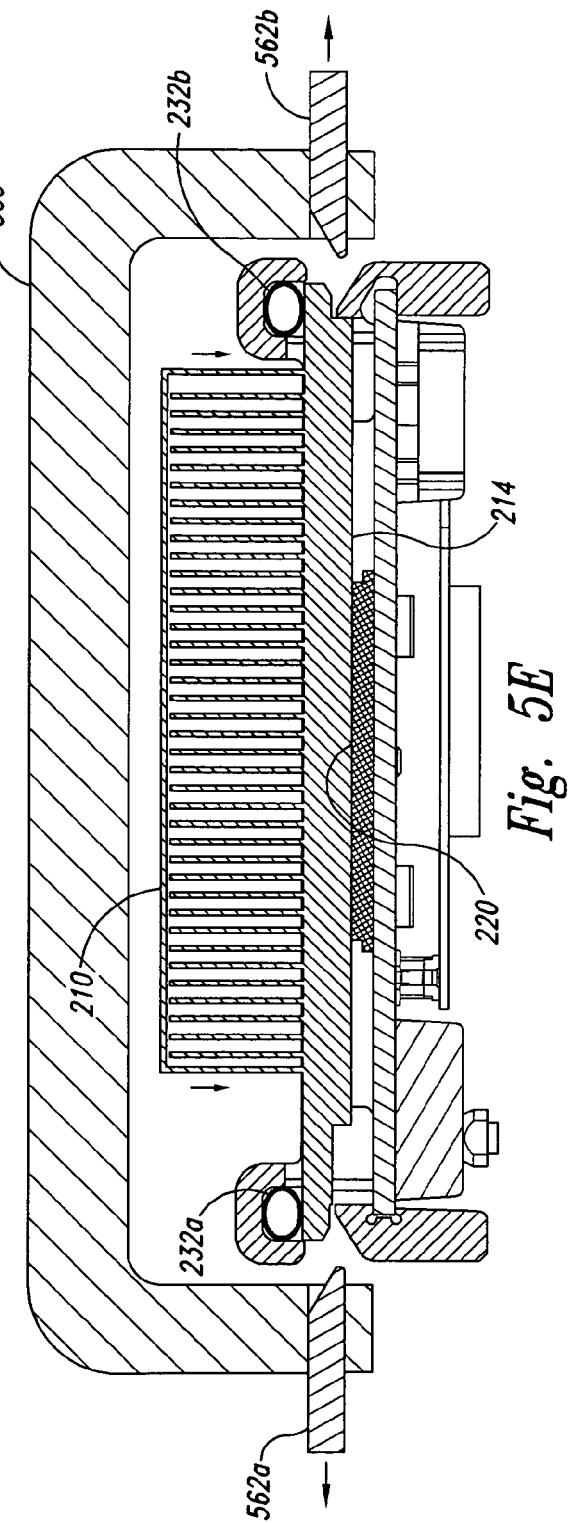
Fig. 5D
Fig. 5E

ASSEMBLIES FOR HOLDING HEAT SINKS AND OTHER STRUCTURES IN CONTACT WITH ELECTRONIC DEVICES AND OTHER APPARATUSES

CROSS-REFERENCE TO RELATED APPLICATION INCORPORATED BY REFERENCE

This application is related to copending U.S. Non-Provisional patent application Ser. No. 10/886,895, entitled "ASSEMBLIES FOR MOUNTING ELECTRONIC DEVICES AND ASSOCIATED HEAT SINKS TO COMPUTER MODULES AND OTHER STRUCTURES," which was filed concurrently herewith and is incorporated herein in its entirety by reference.

TECHNICAL FIELD

The following disclosure relates generally to assemblies for positioning a structure, such as a heat sink, in contact with an apparatus, such as an electronic device.

BACKGROUND

Supercomputers and other large computer systems typically include a large number of computer cabinets arranged in banks. Each cabinet typically holds a large number of computer modules positioned in close proximity to each other for high efficiency. Each module can include a motherboard having a printed circuit or printed wiring assembly (PWA) electrically connecting a plurality of processors, routers, and other microelectronic devices together for data and/or power transmission.

Many of the electronic devices typically found in supercomputers, such as fast processing devices, generate considerable heat during operation. This heat can damage the device and/or degrade performance if not dissipated. Consequently, supercomputers typically include both active and passive cooling systems to maintain device temperatures at acceptable levels.

FIG. 1 is a partially exploded isometric view of a portion of a computer module 100 illustrating an approach for cooling a packaged microelectronic device 120 in accordance with the prior art. In this approach, a heat sink 110 is held in contact with the microelectronic device 120 by a plurality of coil springs 112. The microelectronic device 120 is mounted to a socket 122 that electrically connects the microelectronic device 120 to electrical traces (not shown) on a motherboard 102. Screws 114 extend longitudinally through each of the coil springs 112 and engage threaded sockets 125 protruding from a backplate 126. Threading the screws 114 into the sockets 125 compresses the coil springs 112 against the heat sink 110. The resulting force presses the heat sink 110 against the microelectronic device 120 in a "controlled" manner that is intended to provide good thermal conductivity without damaging the microelectronic device 120.

The microelectronic device 120 can represent any one of a number of different devices, such as fast processors, routers, etc., commonly referred to as "high performance devices." Such devices typically include a large number of electrical connections in a very small volume to avoid signal delays associated with distance. The microelectronic device 120, for example, includes a very fine pitch ball-grid array (BGA) 121 of very small solder balls electrically coupled to corresponding ball pads on a substrate 123. These electrical connections are delicate and susceptible to breakage or damage from stresses caused by the weight of the microelectronic device 120 and movements during shipping, installation, and use. These connections are also very susceptible to damage as a result of pressure exerted by the heat sink 110. As a result, manufacturers of such devices typically limit the pressure that can be applied to the device and the mass that can be attached to the device. Advanced Micro Devices, Inc., for example, specifies a pressure limit of 15 psi and a specified mass limit of 150 grams for certain processors.

One shortcoming associated with the spring-loaded mounting arrangement illustrated in FIG. 1 is that it can cause the heat sink 110 to exert a nonuniform pressure against the microelectronic device 120. The nonuniform pressure can result from a number of different factors, including spring adjustment, manufacturing tolerances, installation errors, etc. Nonuniform pressure is undesirable because it can cause one corner of the heat sink 110 to press against the microelectronic device 120 with a significantly greater pressure than the other corners. This pressure imbalance reduces the thermal conductivity in the low pressure corners. More importantly, perhaps, the pressure in the high pressure corner may exceed the limit set by the manufacturer, resulting in damage to the BGA 121 and/or degradation in device performance.

BRIEF DESCRIPTION OF THE DRAWINGS

FIGS. 5A–5E are cross-sectional end views illustrating various stages in a method of installing a heat sink and an electronic device in a support structure in accordance with an embodiment of the invention.

DETAILED DESCRIPTION

The following disclosure describes several embodiments of structures and methods for positioning heat sinks and other devices in contact with electronic devices and other apparatuses. A structure for holding a heat sink in contact with an electronic device in accordance with one aspect of the invention includes an electronic device holding portion and a heat sink holding portion. The electronic device holding portion is configured to support the electronic device. The heat sink holding portion is configured to position the heat sink in contact with the electronic device. The structure further includes a spring holding portion configured to support a coil spring in transverse compression. When transversely compressed, the coil spring presses the heat sink against the electronic device with a uniform, or at least approximately uniform, pressure that enables the heat sink to efficiently conduct heat away from the electronic device without damaging the device.

A method for drawing heat away from an electronic device in accordance with another aspect of the invention includes positioning a heat sink in contact with the electronic device. The method further includes pressing the heat sink against the electronic device with a coil spring in transverse compression. In one embodiment, positioning a heat sink in contact with the electronic device includes installing the heat sink in a support structure so that the heat sink transversely compresses the coil spring.

Specific details of several embodiments of the invention are described below to provide a thorough understanding of such embodiments. Other details describing well-known structures and systems often associated with computers and related devices are not set forth below to avoid unnecessarily obscuring the description of the various embodiments. Those of ordinary skill in the art will understand that the invention may have other embodiments in addition to those described below with reference to FIGS. 2–7. Such embodiments may include elements other than those described below or may lack one or more of the elements described below.

In the Figures, identical reference numbers identify identical or at least generally similar elements. To facilitate the discussion of any particular element, the most significant digit or digits of any reference number refer to the Figure in which that element is first introduced. Element 210, for example, is first introduced and discussed with reference to FIG. 2.

Figure 2:
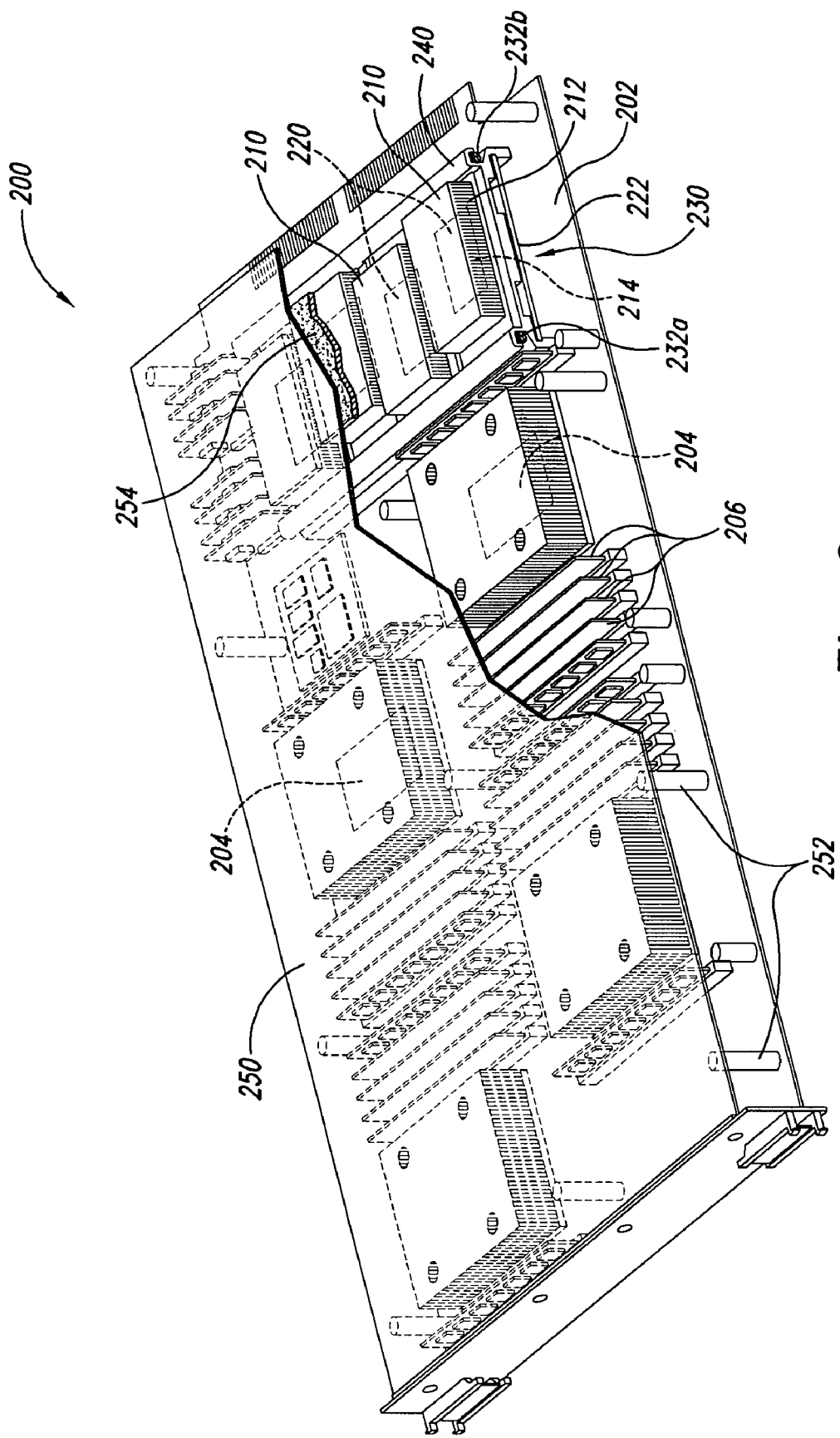
FIG. 2 is an isometric top view of a portion of a computer module having an electronic device mounting assembly configured in accordance with an embodiment of the invention.

FIG. 2 is an isometric top view of a portion of a computer module 200 having an electronic device mounting assembly 230 configured in accordance with an embodiment of the invention. The electronic device mounting assembly 230 ("mounting assembly 230") includes a support structure 240 attached to a motherboard 202 (i.e., a "base structure"). The support structure 240 holds a substrate 222 that carries a plurality of packaged electronic devices 220 (e.g., routers) in a "mezzanine" arrangement above the motherboard 202. The electronic devices 220 can be operatively connected to a plurality of processors 204, memory devices 206, and other electronic devices on the motherboard 202 via electrical traces (not shown) formed in the surface and sublayers of the motherboard 202.

As described in greater detail below, the support structure 240 of the mounting assembly 230 also carries a plurality of heat sinks 210. Each of the heat sinks 210 include a plurality of cooling fins 212 projecting upwardly adjacent to a contact surface 214. The contact surfaces 214 are held against corresponding electronic devices 220 by two coil springs 232 (identified individually as a first coil spring 232a and a second coil spring 232b). The coil springs 232 are transversely compressed in this arrangement. As a result, the coil springs 232 exert constant, or at least approximately constant, forces against the heat sinks 210 throughout a range of deflection. This causes the heat sinks 210 to exert uniform, or at least approximately uniform, pressure against the corresponding electronic devices 220. The uniform pressure enables the heat sinks 210 to efficiently transfer heat without damaging the BGAs (not shown) or other features of the electronic devices 220.

In the illustrated embodiment, the computer module 200 further includes a shroud 250 attached to the motherboard 202 by a plurality of supports 252. In certain embodiments, forced air can be used to cool the various electronic devices 220 mounted to the motherboard 202. In these embodiments, the shroud 250 can facilitate the flow of forced air past the devices to enhance convective cooling. If desired, a compressible and thermally conductive material 254 can be positioned between the heat sinks 210 and the shroud 250 to facilitate conductive heat transfer from the electronic devices 220 to the shroud 250 for additional cooling.

Although the mounting assembly 230 of the illustrated embodiment includes a plurality of electronic devices 220 and a corresponding plurality of heat sinks 210, the present invention is not limited to such embodiments. Accordingly, in other embodiments, mounting assemblies configured in accordance with the present invention can include more or fewer electronic devices 220 and corresponding heat sinks 210. For example, in another embodiment, a mounting assembly configured in accordance with the present invention can include a single electronic device 220 and a single, corresponding heat sink 210. In a further embodiment, a mounting assembly configured in accordance with the present invention can include a plurality of electronic devices 220 and a single, corresponding heat sink for all the devices. In yet another embodiment, a mounting assembly configured in accordance with the present invention can include a single electronic device 220 and a plurality of corresponding heat sinks 210.

Figure 3:
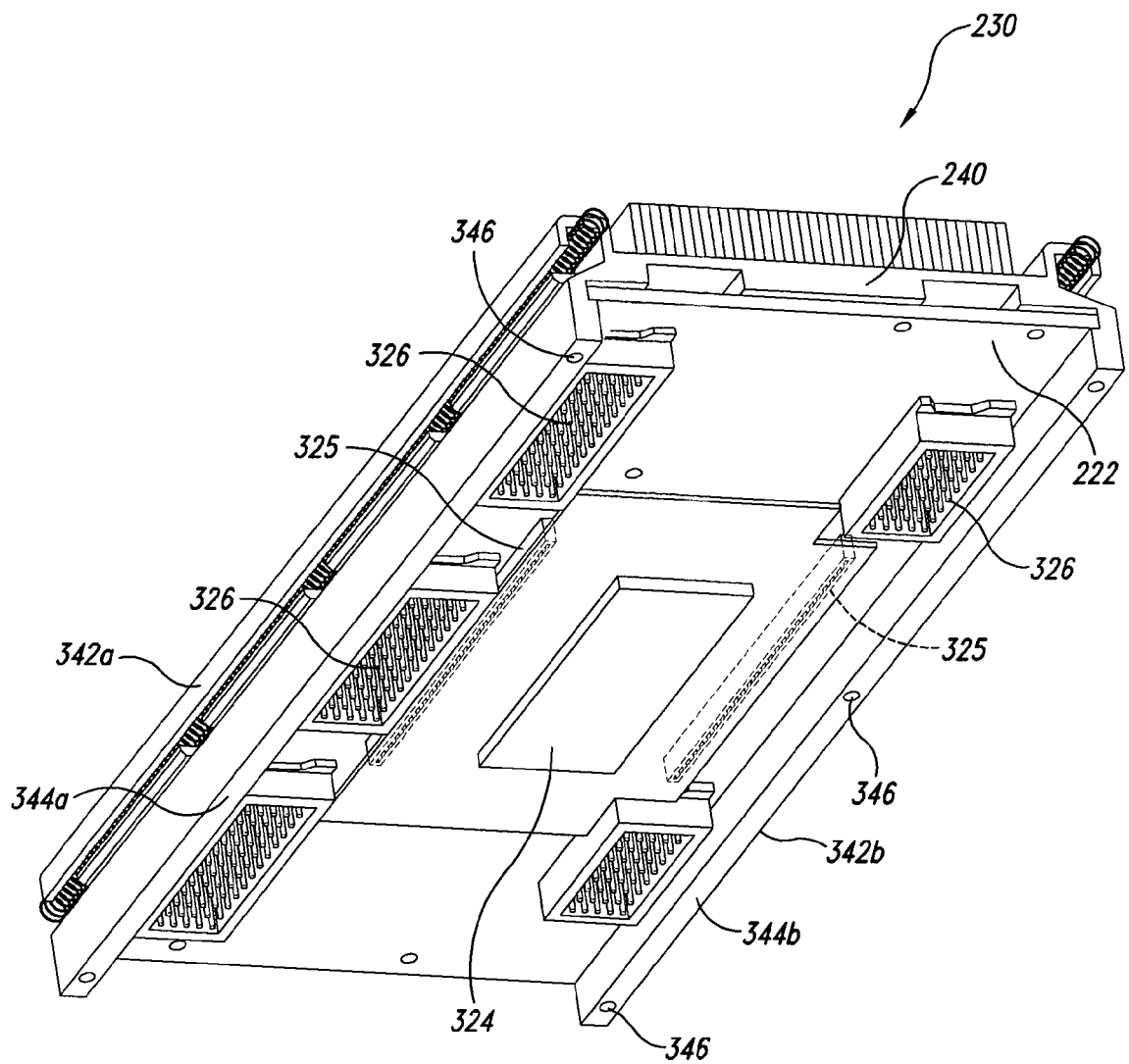
FIG. 3 is an isometric bottom view looking upwardly at the underside of the mounting assembly of FIG. 2.

FIG. 3 is an isometric bottom view looking upwardly at the underside of the mounting assembly 230 of FIG. 2. The support structure 240 includes a first side portion 342a spaced apart from a second side portion 342b. Each side portion 342 includes a corresponding base portion 344 (identified individually as a first base portion 344a and a second base portion 344b). The base portions 344 can project downwardly to offset the electronic devices 220 a preset distance above the motherboard 202 (FIG. 2). This preset distance can vary depending on a number of different factors, including space constraints and cooling requirements. In further embodiments, the preset distance can be eliminated and the electronic devices 220 can be positioned at least proximate to, or in contact with, the motherboard 202. Each base portion 344 includes a plurality of fastener holes 346 configured to engage fasteners (not shown) extending through the motherboard 202 for attachment of the support structure 240 to the motherboard 202.

Figure 1:
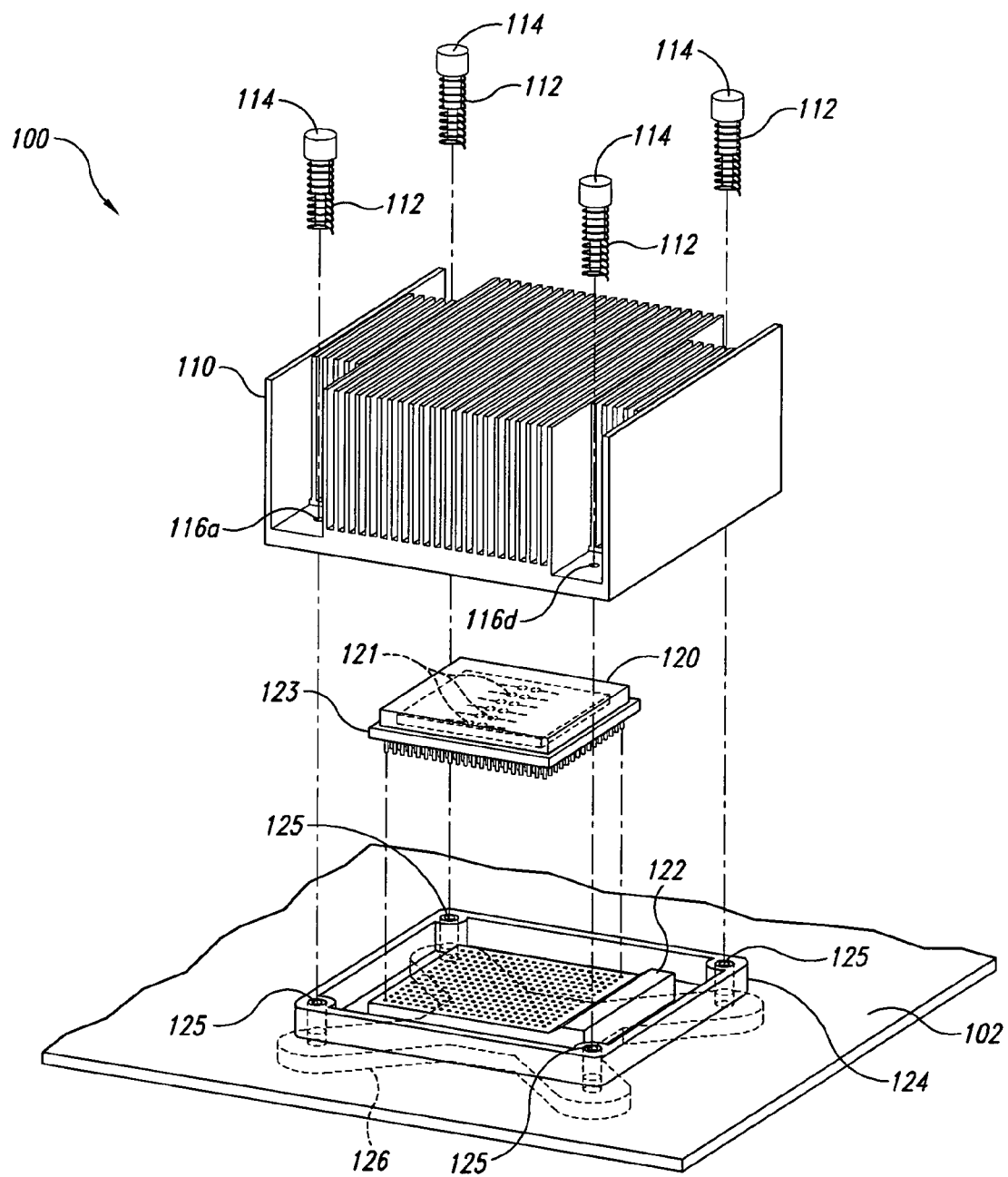
FIG. 1 is a partially exploded isometric view of a portion of a computer module illustrating an approach for cooling a packaged microelectronic device in accordance with the prior art.

In one embodiment, the support structure 240 can be machined or otherwise formed from aluminum having an anodized, dielectric surface finish. In other embodiments, the support structure 240 can be made from other metallic and/or non-metallic materials demonstrating suitable structural, thermal, and/or manufacturing characteristics. One advantage of the support structure 240 is that it is relatively stiff. As a result, a reinforcing backplate (such as the prior art backplate 126 described above with reference to FIG. 1) positioned on the opposite side of the motherboard 202 is not required to prevent flexing of the support structure 240 during use.

A plurality of multi-pin connectors 326 and two socket connectors 325 extend downwardly from the substrate 222. The socket connectors 325 operatively connect a voltage regulator 324 to the electronic devices 220. The multi-pin connectors 326 are configured to releasably engage corresponding connectors (not shown) on the motherboard 202 when the support structure 240 is attached to the motherboard 202. Engagement of the multi-pin connectors 326 operatively connects the electronic devices 220 to one or more of the other electronic devices mounted to the motherboard 202.

Figure 4:
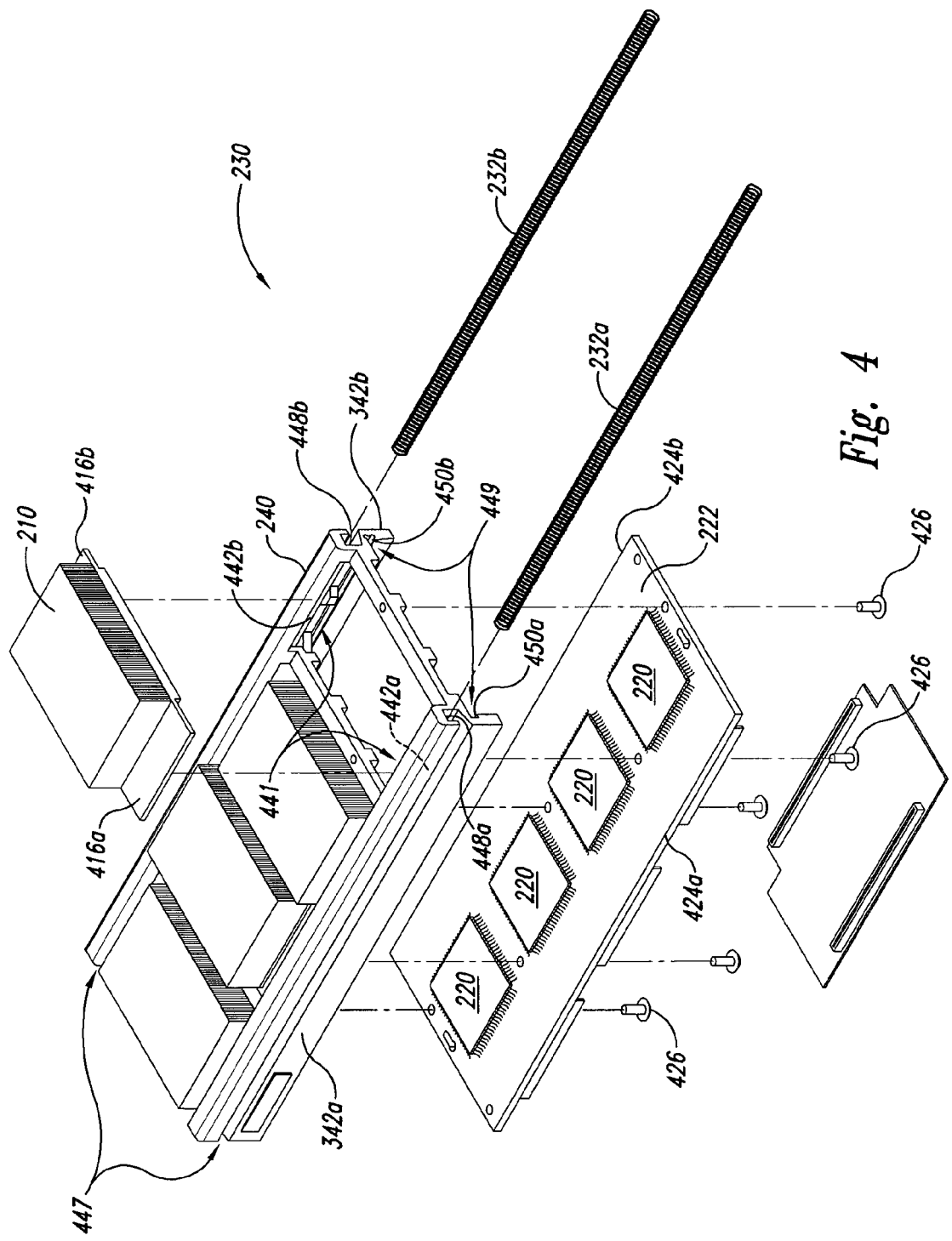
FIG. 4 is an exploded, top isometric view illustrating various features of the mounting assembly of FIGS. 2 and 3 in greater detail.

FIG. 4 is an exploded, top isometric view illustrating various features of the mounting assembly 230 of FIGS. 2 and 3 in greater detail. In one aspect of this embodiment, the support structure 240 includes an electronic device holding portion 449, a heat sink holding portion 441, and a spring holding portion 447.

The spring holding portion 447 includes a first elongate channel 448a positioned toward the first side portion 342a, and a second elongate channel 448b positioned toward the second side portion 342b. Each of the elongate channels 448 is configured to laterally support one of the coil springs 232.

In one embodiment, the coil springs 232 can be made from steel, such as high-strength steel, and can be plated with a thermally efficient material, such as silver and/or copper. The use of steel can give the coil springs 232 desirable properties, including low thermal/stress relaxation and high thermal conductivity. The plating can enhance the thermal conductivity of the steel for efficient heat transfer from the heat sink 210 to the support structure 240. In other embodiments, the coil springs 232 can be made from other materials, including other metallic materials. In further embodiments, other elastically and/or compressible members can be used in place of the coil springs 232. For example, in one other embodiment, a compressible foam material can be used in place of the coil springs 232. In yet another embodiment, a bladder holding air or another gas can be used to provide the uniform compression forces provided by the coil springs 232.

The heat sink holding portion 441 includes a first opening 442a positioned toward the first side portion 342a, and an opposing second opening 442b positioned toward the second side portion 342b. As described in greater detail below, each of the openings 442 is configured to receive a corresponding end portion 416 (identified individually as a first end portion 416a and an opposite second end portion 416b) of one of the heat sinks 210. When the heat sink end portions 416 are positioned in the corresponding openings 442, the coil springs 232 exert a transverse compression force against the end portions 416 pressing the heat sink 210 downwardly toward the corresponding electronic device 220.

The electronic device holding portion 449 includes a first recess 450a positioned toward the first side portion 342a, and an opposing second recess 450b positioned toward the second side portion 342b. As described in greater detail below, each of the recesses 450 is configured to receive a corresponding edge portion 424 (identified individually as a first edge portion 424a and a second edge portion 424b) of the substrate 222 for initial positioning of the electronic devices 220 relative to the heat sinks 210. A plurality of fasteners 426 can then be used to secure the substrate 222 against a mounting plane formed by the support structure 240 for final positioning of the electronic devices 220 against the corresponding heat sinks 210.

Figure 5A:
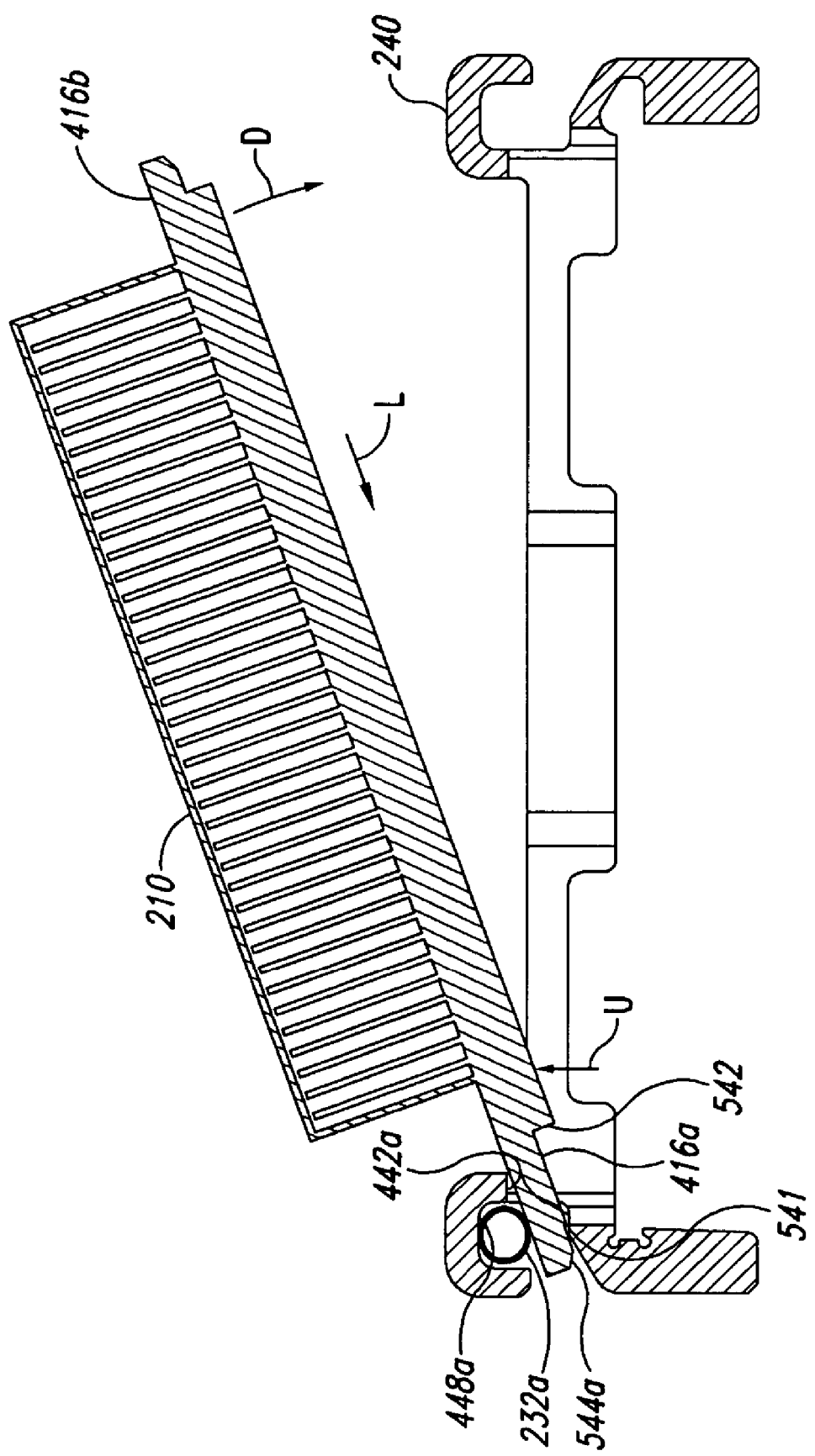
Figure 5B:
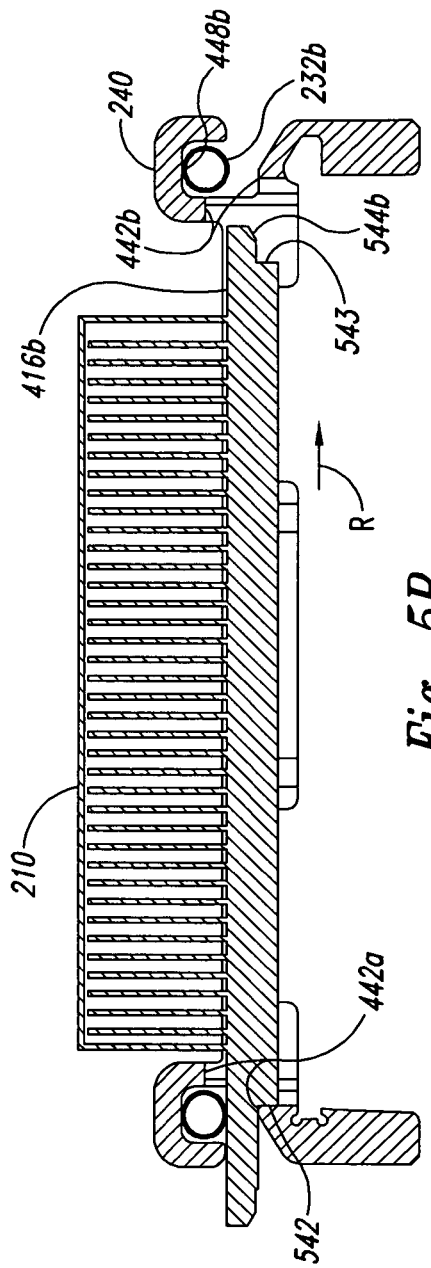

FIGS. 5A–5E are cross-sectional end views illustrating various stages in a method of installing the heat sinks 210 and the electronic devices 220 in the support structure 240 in accordance with an embodiment of the invention. Referring first to FIG. 5A, the method begins by positioning the first coil spring 232a in the first elongate channel 448a. Next, the heat sink 210 is moved in a direction L to insert the first end portion 416a through the first opening 442a and under the first coil spring 232a. A first beveled portion 544a of the first end portion 416a facilitates the initial movement of the first end portion 416a through the first opening 442a. The second end portion 416b is then rotated downwardly in a direction D while the heat sink 210 is simultaneously moved further in the L direction. Eventually, a first step 541 on the first end portion 416a contacts a lower edge of the first opening 442a. At this point, the first end portion 416a is pushed upwardly in a direction U to move the first step 541 over the lower edge of the first opening 442a. Simultaneously, the heat sink 210 is moved further in the L direction while the second end portion 416b is rotated downward in the D direction. Ultimately, a second step 542 on the first end portion 416a contacts the lower edge of the first opening 442a, as illustrated in FIG. 5B.

With reference to FIG. 5B, the second coil spring 232b is positioned in the second elongate channel 448b, and the second end portion 416b of the heat sink 210 is aligned with the second opening 442b. Next, the heat sink 210 is moved in a direction R to insert the second end portion 416b through the second opening 442b and under the second coil spring 232b. A second beveled portion 544b facilitates this movement. The heat sink 210 continues in the R direction until a third step 543 on the second end portion 416b contacts a lower edge of the second opening 442b, as shown in FIG. 5C.

Figure 5C:
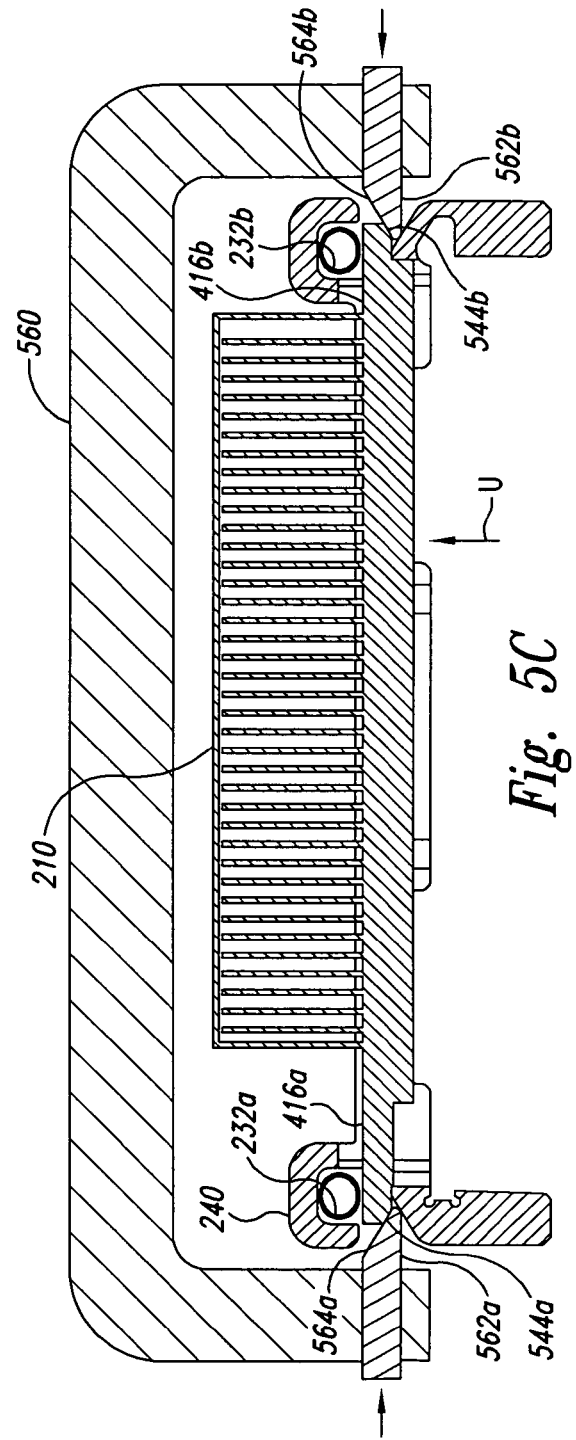

With reference to FIG. 5C, when the heat sink 210 is in the illustrated position, the end portions 416 of the heat sink 210 transversely compress the springs 232 by a preset amount (e.g., approximately five percent). In one aspect of this embodiment, it is desirable to move the heat sink 210 further in the U direction relative to the support structure 240 to create clearance for subsequent installation of the corresponding electronic device 220 (FIG. 4). This clearance reduces the possibility of the electronic device 220 contacting the heat sink 210 during installation and sustaining damage from over-pressure. In one embodiment, a preloading tool 560 having opposing drivers 562 (identified individually as a first driver 562a and a second driver 562b) can be employed to move the heat sink 210 in the U direction and compress the springs 232. Each driver 562 includes a tapered surface 564 (shown individually as a first tapered surface 564a and a second tapered surface 564b) configured to slidably engage the beveled portion 544 of the corresponding end portion 416. Inward movement of one or both of the drivers 562 toward the other causes the heat sink 210 to move in the U direction and further compress the springs 232, as illustrated in FIG. 5D.

Referring next to FIG. 5D, when the heat sink 210 is retracted upwardly as shown, the second edge portion 424b of the substrate 222 is inserted into the second recess 449b of the support structure 240. From this position, the first edge portion 424a of the substrate 222 is rotated upwardly in direction U until the first edge portion 424a is aligned with the first recess 449a. Next, the substrate 222 is moved in the L direction to insert the first edge portion 424a into the first recess 449a, as illustrated in FIG. 5E.

Referring next to FIG. 5E, once the fasteners 426 (FIG. 4) have been installed to secure the substrate 222 in position in the support structure 240, the drivers 562 of the preloading tool 560 can be retracted outwardly to lower the heat sink 210 down against the electronic device 220. When the contact surface 214 of the heat sink 210 contacts the electronic device 220, the springs 232 will be transversely compressed a preset amount (e.g., approximately 25 percent). The amount of spring compression can be calibrated to press the heat sink 210 against the electronic device 220 with a uniform pressure that provides efficient thermal conduction without risk of damaging the BGAs or other features of the electronic device 220.

Although the foregoing FIGS. 2–5E illustrate an embodiment of the invention in which the coil springs 232 are transversely compressed against the heat sink 210, in other embodiments other arrangements utilizing transversely compressed coil springs can be employed without departing from the spirit or scope of the present invention. For example, in another embodiment, the heat sink 210 can be fixed relative to the support structure 240, and the substrate 222 that supports the electronic device 220 can be at least partially movable relative to the support structure 240. In this embodiment, the coil springs 232 (or similar coil springs) can be transversely compressed against a portion of the substrate 222 to press the electronic device 220 against the heat sink 210 with a uniform, or approximately uniform, pressure.

The heat sink holding features of the present invention are not limited to use with the particular mezzanine-type support structure described above with reference to FIGS. 2–5E. To the contrary, these features (including, e.g., the transverse coil springs) can be used with other support structure configurations without departing from the spirit or scope of the present invention. For example, in other embodiments, the transverse coil spring arrangement can be used to hold heat sinks in contact with an electronic devices that are supported independently from the heat sinks. Further, in another embodiment, the transverse coil spring arrangement can be used to hold heat sinks in contact with electronic devices positioned directly on, or at least approximately on, a surface of a motherboard. In addition, the transverse coil spring arrangement taught by the present disclosure is not limited to use with heat sinks, but extends to other applications in which it is desired to hold a first part in contact with a second part with a uniform, or at least approximately uniform, pressure. Such applications can include, for example, holding a first electrical connector (e.g., a multi-pin connector) in contact with a cooperating, second connector; or holding a part in contact with a corresponding mounting structure that is delicate and susceptible to damage from excess or uneven pressure. Accordingly, the present invention is not limited to the particular embodiments of transversely compressed coil springs described above, but extends to all arrangements of transversely compressed coil springs falling within the scope of the appended claims.

Figure 6:
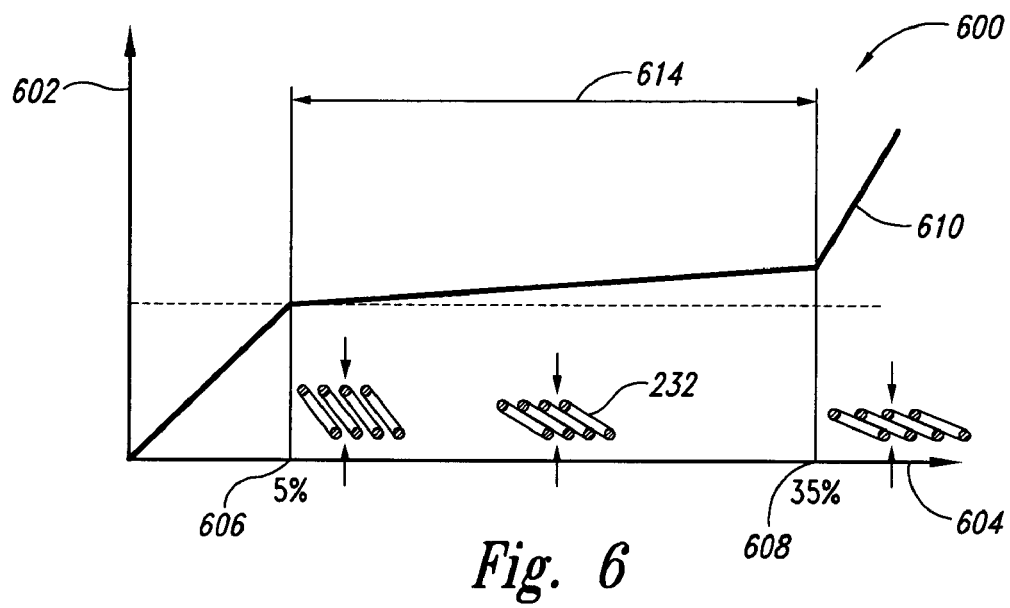
FIG. 6 is a diagram illustrating a graph of spring force versus transverse compression for a canted coil spring in accordance with an embodiment of the invention.

FIG. 6 is a diagram illustrating a graph 600 of force versus transverse compression for a canted coil spring, such as the coil springs 232 of the present invention. Force is measured along a vertical axis 602, and transverse compression as a percentage of uncompressed spring diameter is measured along a horizontal axis 604. As a plot 610 illustrates, the compression force increases only gradually in a working range 614 between an initial working compression 606 and a maximum working compression 608. In one embodiment, the initial working compression 606 can correspond to a transverse spring compression of about three to 10 percent (e.g., about five percent), and the maximum working compression 608 can correspond to a transverse compression of about 25 to 50 percent (e.g., about 35 percent).

As the graph 600 illustrates, one advantage of using coil springs in transverse compression is that they provide approximately constant compression force in the working range 614. This feature allows the springs 232 to be selected so that they are compressed to approximately the middle of the working range 614 (e.g., about 20 to 25 percent) when the heat sink 210 is pressing against the electronic device 220 under normal operating conditions (see, for example, FIG. 5E). In this way, minor variations in spring compression as a result of manufacturing tolerances, assembly errors, and other factors will not cause the spring force to change appreciably. As a result, the force with which the heat sink 210 presses against the electronic device 220 will remain fairly uniform, thereby avoiding damage to the electronic device 220 while providing consistent, efficient heat transfer.

Figure 7:
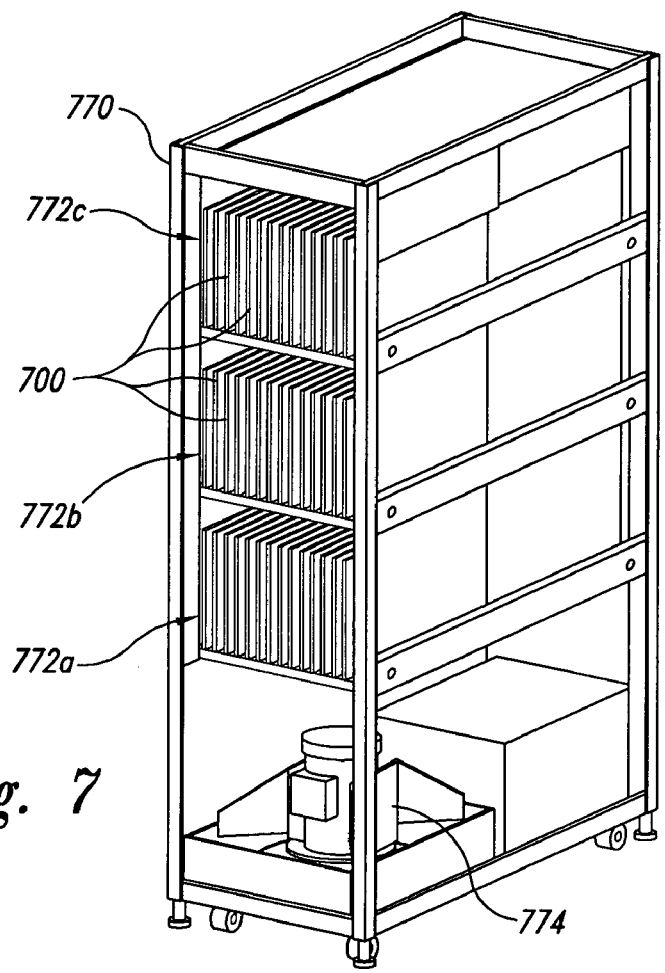
FIG. 7 is a top isometric view of a computer cabinet carrying a plurality of computer modules configured in accordance with an embodiment of the invention.

FIG. 7 is an isometric top view of a computer cabinet 770 configured in accordance with an embodiment of the invention. Exterior panels have been removed from the computer cabinet 770 for purposes of clarity. In one aspect of this embodiment, the computer cabinet 770 can be one of a plurality of computer cabinets forming a supercomputer system. The computer cabinet 770 can include a plurality of computer module holding portions 772 (identified individually as a first module holding portion 772a, a second module holding portion 772b, and a third module holding portion 772c). Each of the module holding portions 772 can carry a plurality of computer modules 700 positioned in edgewise orientation in close proximity to each other. In one aspect of this embodiment, one or more of the computer modules 700 can be at least generally similar in structure and function to the computer module 200 described above with reference to FIG. 2.

In the illustrated embodiment, the computer cabinet 770 includes an air mover 774 (e.g., a fan) positioned below the module holding portions 772. The air mover 774 can move cooling air from a floor plenum (not shown) past the plurality of computer modules 700 to cool the various electronic devices mounted to the associated motherboards. The cooling air can be exhausted through an air outlet (not shown) positioned toward an upper portion of the computer cabinet 770.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A structure for holding a heat sink in contact with an electronic device, the structure comprising:
   an electronic device holding portion configured to support the electronic device;
   a heat sink holding portion configured to position the heat sink in contact with the electronic device; and
   a spring holding portion configured to support a coil spring in transverse compression, wherein the coil spring exerts a transverse compression force against the heat sink in a first direction, causing the heat sink to press against the electronic device in the first direction when the coil spring is laterally supported in the spring holding portion, and wherein at least a portion of the heat sink is operably disposed between the coil spring and the electronic device.

2. The structure of claim 1 wherein the spring holding portion includes an elongate channel configured to receive the coil spring.

3. The structure of claim 1 wherein the spring holding portion includes an elongate channel configured to receive the coil spring, and wherein a plurality of coils of the coil spring are canted when the coil spring is supported in the spring holding portion.

4. The structure of claim 1 wherein the spring holding portion includes an elongate channel configured to receive the coil spring, and wherein the coil spring is oriented parallel to the elongate channel when the coil spring is positioned in the elongate channel.

5. The structure of claim 1 wherein the heat sink holding portion includes an opening configured to receive an end of the heat sink.

6. The structure of claim 1 wherein the heat sink holding portion includes a first opening facing a first direction and a second opening facing a second direction opposite to the first direction, wherein the first opening is configured to receive a first end of the heat sink by insertion of the first end through the first opening in the second direction, and wherein the second opening is configured to receive a second end of the heat sink by insertion of the second end through the second opening in the first direction.

7. The structure of claim 1 wherein the electronic device holding portion includes a recess configured to receive an edge portion of a substrate that supports the electronic device.

8. A structure for holding a heat sink in contact with an electronic device, the structure comprising:
   an electronic device holding portion configured to support the electronic device;
   a heat sink holding portion configured to position the heat sink in contact with the electronic device; and
   a spring holding portion configured to support a coil spring in transverse compression, wherein the coil spring exerts a transverse compression force causing the heat sink to press against the electronic device when the coil spring is laterally supported in the spring holding portion, and wherein the electronic device holding portion includes a first recess facing a first direction and a second recess facing a second direction opposite to the first direction, wherein the first recess is configured to receive a first edge portion of a substrate that supports the electronic device by insertion of the first edge portion into the first recess in the second direction, and wherein the second recess is configured to receive a second edge portion of the substrate by insertion of the second edge portion into the second recess in the first direction.

9. A heat sink assembly comprising:
   a support structure;
   a heat sink carried by the support structure, the heat sink having a contact surface configured to contact an electronic device; and
   a coil spring having a longitudinal axis oriented at least approximately parallel to the contact surface of the heat sink, wherein the coil spring is configured to exert a transverse compression force in a first direction causing the contact surface of the heat sink to press against the electronic device in the first direction, and wherein at least a portion of the heat sink is operably disposed between the coil spring and the electronic device.

10. The heat sink assembly of claim 9 wherein the contact surface of the heat sink is at least approximately flat.

11. The heat sink assembly of claim 9 wherein the support structure further includes an electronic device holding portion configured to support the electronic device in contact with the heat sink.

12. The heat sink assembly of claim 9 wherein the support structure further includes a mounting plane to which a substrate carrying the electronic device is attached, and wherein the longitudinal axis of the coil spring is oriented at least approximately parallel to the mounting plane.

13. The heat sink assembly of claim 9 wherein the coil spring is transversely compressed between a portion of the heat sink and a portion of the support structure.

14. The heat sink assembly of claim 9 wherein the coil spring is a first coil spring transversely compressed between a first portion of the heat sink and a first portion of the support structure, and wherein the mounting assembly further comprises a second coil spring transversely compressed between a second portion of the heat sink and a second portion of the support structure.

15. The heat sink assembly of claim 9 wherein the heat sink further includes a plurality of cooling fins projecting away from the contact surface.

16. An electronic device mounting assembly comprising:
   a support structure having an electronic device holding portion configured to support an electronic device;
   a heat sink configured to contact the electronic device when the electronic device is supported by the electronic device holding portion of the support structure; and
   a coil spring configured to exert a transverse compression force against the heat sink in a first direction causing the heat sink to press against the electronic device in the first direction when the electronic device is supported by the electronic device holding portion of the support structure.

17. The electronic device mounting assembly of claim 16 wherein the coil spring is transversely compressed between a portion of the heat sink and a portion of the support structure.

18. The electronic device mounting assembly of claim 16 wherein the coil spring is a first coil spring transversely compressed between a first portion of the heat sink and a first portion of the support structure, and wherein the mounting assembly further comprises a second coil spring transversely compressed between a second portion of the heat sink and a second portion of the support structure.

19. The electronic device mounting assembly of claim 16 wherein the electronic device holding portion of the support structure includes a support surface configured to support a packaged microelectronic device.

20. The electronic device mounting assembly of claim 16, further comprising a packaged microelectronic device supported by the electronic device holding portion of the support structure.

21. The electronic device mounting assembly of claim 16 wherein the heat sink includes a contact surface configured to contact the electronic device, and wherein the heat sink further includes a plurality of cooling fins projecting away from the contact surface.

22. The electronic device mounting assembly of claim 16 wherein the heat sink includes a contact surface configured to contact the electronic device and a plurality of cooling fins projecting away from the contact surface, wherein the contact surface is positioned between a first end portion of the heat sink and a second end portion of the heat sink, wherein the coil spring is a first coil spring transversely compressed between the first end portion of the heat sink and a first portion of the support structure, and wherein the mounting assembly further comprises a second coil spring transversely compressed between the second end portion of the heat sink and a second portion of the support structure.

23. A computer module comprising:
   an electronic device;
   a heat sink in contact with the electronic device; and
   a coil spring exerting a transverse compression force against the heat sink in a first direction causing the heat sink to press against the electronic device in the first direction, wherein at least a portion of the heat sink is operably disposed between the coil spring and the electronic device.

24. The computer module of claim 23, further comprising:
   a base structure; and
   a support structure attached to the base structure, wherein the support structure carries the electronic device, and wherein the coil spring is transversely compressed between a portion of the heat sink and a portion of the support structure.

25. The computer module of claim 23, further comprising:
a base structure; and
a support structure attached to the base structure, wherein the support structure carries the electronic device, wherein the coil spring is a first coil spring transversely compressed between a first portion of the heat sink and a first portion of the support structure, and wherein the mounting assembly further comprises a second coil spring transversely compressed between a second portion of the heat sink and a second portion of the support structure.

26. The computer module of claim 23, further comprising:
a base structure; and
a support structure attached to the base structure, wherein the support structure carries the electronic device away from the base structure defining an open space therebetween.

27. The computer module of claim 23, further comprising a base structure carrying an electrical connector, wherein the electronic device is operably coupled to the electrical connector.

28. The computer module of claim 23, further comprising a base structure carrying an electrical trace, wherein the electronic device is operably coupled to the electrical trace.

29. The computer module of claim 23, further comprising a shroud attached to the base structure, wherein the electronic device is positioned between the shroud and the base structure.

30. The computer module of claim 23, further comprising a shroud attached to the base structure, wherein the electronic device and the heat sink are positioned between the shroud and the base structure.

31. The computer module of claim 23 wherein the base structure includes a motherboard.

32. A computer system comprising:
a first computer module having a first electronic device mounted to a first base structure;
a second computer module spaced apart from the first computer module, the second computer module including:
a second electronic device mounted to a second base structure;
a heat sink in contact with the second electronic device, the heat sink being movable relative to the second base structure; and
a coil spring exerting a transverse compression force against the heat sink in a first direction causing the heat sink to press against the second electronic device in the first direction.

33. The computer system of claim 32, further comprising:
a cabinet housing the first and second computer modules; and
an air mover operatively associated with the cabinet and configured to move cooling air through the cabinet and past the first and second computer modules.

34. The computer system of claim 32, further comprising:
a cabinet housing the first and second computer modules;
a shroud attached to the second base structure, wherein the second electronic device is positioned between the shroud and the second base structure; and
an air mover operatively associated with the cabinet and configured to move cooling air through the cabinet and between the shroud and the second base structure to cool the second electronic device.

35. The computer system of claim 32 wherein the coil spring is a first coil spring transversely compressed between a first portion of the heat sink and a first portion of the support structure, and wherein the mounting assembly further comprises a second coil spring transversely compressed between a second portion of the heat sink and a second portion of the support structure.

36. The computer system of claim 32 wherein the heat sink includes a contact surface configured to contact the electronic device and a plurality of cooling fins projecting away from the contact surface, wherein the contact surface is positioned between a first end portion of the heat sink and a second end portion of the heat sink, wherein the coil spring is a first coil spring transversely compressed between the first end portion of the heat sink and a first portion of the support structure, and wherein the mounting assembly further comprises a second coil spring transversely compressed between the second end portion of the heat sink and a second portion of the support structure.

37. A method for drawing heat away from an electronic device, the method comprising:
positioning a heat sink in contact with the electronic device; and
exerting a force against the heat sink in a first direction with a coil spring in transverse compression, thereby causing the heat sink to press against the electronic device in the first direction.

38. The method of claim 37 wherein exerting a force against the heat sink includes transversely compressing the coil spring against a portion of the heat sink.

39. The method of claim 37 wherein the electronic device is supported on a substrate, and wherein exerting a force against the heat sink includes transverse transversely compressing the coil spring against a portion of the substrate.

40. The method of claim 37, further comprising:
supporting the electronic device with a support structure; and
movably coupling the heat sink to the support structure, wherein exerting a force against the heat sink includes transversely compressing the coil spring between a portion of the support structure and a portion of the heat sink.

41. The method of claim 37 wherein the coil spring is a first coil spring, and wherein exerting a force against the heat sink includes transversely compressing the first coil spring against a first portion of the heat sink and transversely compressing a second coil spring against a second portion of the heat sink.

42. The method of claim 37 wherein the coil spring is a first coil spring, and wherein exerting a force against the heat sink includes transversely compressing the first coil spring against a first end portion of the heat sink and transversely compressing a second coil spring against a second end portion of the heat sink, wherein the second end portion of the heat sink is opposite the first end portion.

43. The method of claim 37 wherein the coil spring is a first coil spring, wherein the heat sink includes a plurality of cooling fins extending between a first end portion and a second end portion, and wherein exerting a force against the heat sink includes transversely compressing the first coil spring against the first end portion of the heat sink and transversely compressing a second coil spring against a second end portion of the heat sink, wherein the second end portion of the heat sink is opposite to the first end portion.

44. The method of claim 37, further comprising:
supporting the electronic device with a support structure; and operatively coupling the heat sink to the support structure.

45. The method of claim 37, further comprising flowing air past the heat sink.

46. A method for mounting an electronic device to a base structure, the method comprising:
   supporting the electronic device with a support structure;
   supporting a heat sink with the support structure;
   exerting a force against the heat sink in a first direction with a coil spring in transverse compression;
   pressing the heat sink against the electronic device in the first direction with the coil spring in transverse compression; and
   attaching the support structure to the base structure.

47. The method of claim 46, further comprising operably coupling the electronic device to an electrical connector carried by the base structure.

48. The method of claim 46 wherein attaching the support structure to the base structure includes attaching the support structure to a motherboard.

49. The method of claim 46 wherein the coil spring is a first coil spring, and wherein pressing the heat sink against the electronic device includes transversely compressing the first coil spring against a first portion of the heat sink and transversely compressing a second coil spring against a second portion of the heat sink.

50. A system for drawing heat away from an electronic device, the system comprising:
   means for positioning a heat sink in contact with the electronic device;
   means for transversely compressing a coil spring against at least a portion of the heat sink in a first direction; and
   means for pressing the heat sink against the electronic device in the first direction with the coil spring in transverse compression.

51. The system of claim 50 wherein the means for pressing the heat sink against the electronic device include means for transversely compressing the coil spring against a portion of the heat sink.

52. The system of claim 50 wherein the electronic device is supported on a substrate, and wherein the means for pressing the heat sink against the electronic device include means for transversely compressing the coil spring against a portion of the substrate.

53. The system of claim 50, further comprising:
   means for supporting the electronic device with a support structure; and
   means for movably coupling the heat sink to the support structure, wherein the means for pressing the heat sink against the electronic device include means for transversely compressing the coil spring between a portion of the support structure and a portion of the heat sink.

54. The system of claim 50 wherein the coil spring is a first coil spring, and wherein the means for pressing the heat sink against the electronic device include means for transversely compressing the first coil spring against a first portion of the heat sink and means for transversely compressing a second coil spring against a second portion of the heat sink.

55. The system of claim 50, further comprising means for flowing air past the heat sink.

* * * * *

UNITED STATES PATENT AND TRADEMARK OFFICE
CERTIFICATE OF CORRECTION

| | | |
|---|---|---|
| PATENT NO. | : 7,177,156 B2 | Page 1 of 1 |
| APPLICATION NO. | : 10/886911 | |
| DATED | : February 13, 2007 | |
| INVENTOR(S) | : Yatskov et al. | |

It is certified that error appears in the above-identified patent and that said Letters Patent is hereby corrected as shown below:

Title page, on page 2, under "U.S. Patent Documents", in column 1, line 11, after "6,644,384 B2" delete "5/2003" and insert -- 11/2003 --, therefor.

In column 5, lines 7–11, delete "The spring holding portion 447 includes a first elongate channel 448a positioned toward the first side portion 342a, and a second elongate channel 448b positioned toward the second side portion 342b. Each of the elongate channels 448 is configured to laterally support one of the coil springs 232." and insert the same on Col. 5, Line 6, after "portion 447." as the continuation of the same paragraph.

In column 12, line 33, in Claim 39, before "transversely" delete "transverse".

Signed and Sealed this

Eighth Day of July, 2008

JON W. DUDAS
*Director of the United States Patent and Trademark Office*